United States Patent
Dussarrat et al.

(10) Patent No.: US 7,192,626 B2
(45) Date of Patent: Mar. 20, 2007

(54) METHODS FOR PRODUCING SILICON NITRIDE FILMS AND SILICON OXYNITRIDE FILMS BY THERMAL CHEMICAL VAPOR DEPOSITION

(75) Inventors: Christian Dussarrat, Ibaraki (JP); Jean-Marc Girard, Paris (FR); Takako Kimura, Ibaraki (JP); Naoki Tamaoki, Tokyo (JP); Yuusuke Sato, Tokyo (JP)

(73) Assignee: L'Air Liquide, Société Anonyme á Directoire et Conseil de Surveillance pour l'Etude et l'Exploitation des Procédés Georges Claude, Paris (FR)

( * ) Notice: Subject to any disclaimer, the term of this patent is extended or adjusted under 35 U.S.C. 154(b) by 344 days.

(21) Appl. No.: 10/669,623

(22) Filed: Sep. 24, 2003

(65) Prior Publication Data

US 2005/0100670 A1 May 12, 2005

(30) Foreign Application Priority Data

Sep. 25, 2002 (JP) .............................. 2002-279880

(51) Int. Cl.
*C23C 16/34* (2006.01)
(52) U.S. Cl. ................. 427/255.394; 427/579
(58) Field of Classification Search ........... 427/255.29, 427/255.393, 255.394, 578, 579
See application file for complete search history.

(56) References Cited

U.S. PATENT DOCUMENTS

| | | | | |
|---|---|---|---|---|
| 4,200,666 A | * | 4/1980 | Reinberg | 427/579 |
| 4,720,395 A | * | 1/1988 | Foster | 427/162 |
| 5,618,579 A | * | 4/1997 | Boire et al. | 427/166 |
| 5,968,611 A | * | 10/1999 | Kaloyeros et al. | 427/579 |
| 6,365,231 B2 | * | 4/2002 | Sato et al. | 427/255.39 |
| 6,566,281 B1 | * | 5/2003 | Buchanan et al. | 438/786 |
| 6,630,413 B2 | * | 10/2003 | Todd | 438/795 |
| 6,645,884 B1 | * | 11/2003 | Yang et al. | 438/791 |
| 6,821,825 B2 | * | 11/2004 | Todd et al. | 438/150 |
| 6,936,548 B2 | * | 8/2005 | Dussarrat et al. | 438/769 |
| 2005/0085098 A1 | * | 4/2005 | Timmermans et al. | 438/794 |
| 2005/0136693 A1 | * | 6/2005 | Hasebe et al. | 438/791 |
| 2005/0142716 A1 | * | 6/2005 | Nakajima et al. | 438/197 |

FOREIGN PATENT DOCUMENTS

JP 6338497 A * 12/1994

* cited by examiner

*Primary Examiner*—Bret Chen
(74) *Attorney, Agent, or Firm*—Linda K. Russell; Christopher J. Cronin

(57) ABSTRACT

Silicon nitride film is formed on substrate by feeding trisilylamine and ammonia into a CVD reaction chamber that contains a substrate. The ammonia gas/trisilylamine gas flow rate ratio is set to a value of at least about 10 and/or the thermal CVD reaction is run at a temperature no greater than about 600° C. Silicon oxynitride is obtained by introducing an oxygen source gas into the CVD reaction chamber. This method avoids the production of ammonium chloride and/or the incorporation of carbonaceous contaminants which are detrimental to the quality of the deposited film.

16 Claims, 5 Drawing Sheets temperature in reaction chamber (°C)

METHODS FOR PRODUCING SILICON NITRIDE FILMS AND SILICON OXYNITRIDE FILMS BY THERMAL CHEMICAL VAPOR DEPOSITION

This application claims the benefit of priority under 35 U.S.C. § 119(a) and (b) to Japanese Application No. 2002-279880, filed Sep. 25, 2002, the entire contents of which are incorporated herein by reference.

BACKGROUND

This invention relates to methods for producing silicon nitride films and silicon oxynitride films. More particularly, this invention relates to methods for producing silicon nitride films and silicon oxynitride films by thermal chemical vapor deposition (thermal CVD).

Silicon nitride films have excellent barrier properties and an excellent oxidation resistance and as a consequence are used in the fabrication of semiconductor devices, for example, as an etch-stop layer, barrier layer, or gate dielectric layer, and in oxide/nitride stacks.

Plasma-enhanced CVD (PECVD) and low-pressure CVD (LPCVD) are the methods primarily used at the present time to form silicon nitride films.

PECVD is typically carried out by introducing a silicon source (typically silane) and a nitrogen source (typically ammonia, but more recently nitrogen) between a pair of parallel plate electrodes and applying high-frequency energy across the electrodes at low temperatures (about 300° C.) and low pressures (1 mtorr to 1 torr) in order to induce the generation of a plasma from the silicon source and nitrogen source. The active silicon species and active nitrogen species in the resulting plasma react with each other to produce a silicon nitride film. The silicon nitride films formed in this manner by PECVD typically do not have a stoichiometric composition and are also hydrogen rich and accordingly exhibit a low film density, a poor step coverage, a fast etching rate, and a poor thermal stability.

LPCVD uses low pressures (0.1 to 2 torr) and high temperatures (700° C. to 900° C.) and produces silicon nitride films with a quality superior to that of the silicon nitride films produced by PECVD. At the present time silicon nitride is typically produced by LPCVD by the reaction of dichlorosilane and gaseous ammonia. However, ammonium chloride is produced as a by-product in the reaction of dichlorosilane and gaseous ammonia in this LPCVD procedure: this ammonium chloride accumulates in and clogs the reactor exhaust lines and also deposits on the wafer.

Methods using chlorine-free silicon nitride precursors, i.e., alkylsilanes, aminosilanes, have been proposed in order to solve the aforementioned problems. All of these precursors, however, contain carbon. In accordance with the present invention, the inventors have discovered that the use of these precursors, either alone or in combination with ammonia, results in the incorporation of silicon carbide and/or free carbon in the resulting silicon nitride film and a deterioration in the insulating characteristics of this film.

This problem also occurs when the aforementioned prior art precursors are used to produce silicon oxynitride films (with the same precursors, nitrogen containing gases plus an oxygen containing gas, which are films that have the same properties and applications as silicon nitride films.

The formation of silicon nitride on a silicon oxide film by the reaction of ammonia and trisilylamine (TSA) at 720–740° C. and an ammonia (TSA partial pressure ratio of 5:1; TSA partial pressure=$5\times10^{-2}$ torr) has been reported very recently (M. Copel et al., Applied Physics Letters, Vol. 74, Number 13, 1999). However, this article does not go beyond reporting on the silicon nitride growth mechanism, nor does it provide any evaluation of the properties of the produced silicon nitride films. Moreover, this article is silent on the formation of silicon oxynitride films using TSA.

Accordingly, there is a need to day to provide a CVD-based method that can produce silicon nitride films and silicon oxynitride films with improved film characteristics without the accompanying generation of ammonium chloride and without incorporation of carbonaceous contaminants into the films.

SUMMARY

As the result of extensive investigations directed to addressing the issues described hereabove, the present inventors found that trisilylamine, aside from its lack of chlorine and carbon, reacts with ammonia to produce high-quality silicon nitride and reacts with ammonia and an oxygen-containing gas to produce high-quality silicon oxynitride. These reactions are also not accompanied by the appearance of reaction by-products downstream from the reaction chamber. The inventors also discovered that the ammonia:trisilylamine feed flow rate ratio into the reaction chamber during the production of silicon nitride film by the reaction of trisilylamine with ammonia influences the compositional stability of the resulting silicon nitride film. The inventors further discovered that the reaction temperature (film formation temperature) during the production of silicon nitride film by the reaction of trisilylamine with ammonia influences the step coverage afforded by the silicon nitride film product. The present invention is based on these discoveries.

According to a first aspect of this invention there is provided a method for producing silicon nitride films by thermal chemical vapor deposition, comprising the steps of feeding a trisilylamine gas and an ammonia gas into a chemical vapor deposition reaction chamber that holds at least one substrate, forming a silicon nitride film on said at least a substrate by reacting the two gases under predetermined temperature and pressure conditions, said method further comprising the step of providing a flow rate ratio of the ammonia gas to trisilylamine gas fed into said reaction chamber equal to or greater than 10.

Preferably, the predetermined temperature conditions of the reaction between the aforesaid trisilylamine and ammonia gas is set at a temperature which is equal to or lower than 600° C.

According to a second aspect of this invention, there is provided a method for producing silicon nitride films by thermal chemical vapor deposition, comprising the steps of feeding a trisilylamine gas and an ammonia gas into a chemical vapor deposition reaction chamber that holds at least one substrate, forming a silicon nitride film on said at least one substrate by reacting the two gases afore mentioned under predetermined temperature and pressure conditions, said method further comprising the step of setting the predetermined temperature of the reaction between the aforesaid trisilylamine and ammonia gas is set at a value equal to or lower than 600° C.

According to another aspect of this invention, there is provided a method for producing silicon oxynitride films by thermal chemical vapor deposition, said method comprising the steps of:

feeding a trisilylamine gas, an ammonia gas, and an oxygen-containing gas into a chemical vapor deposition reaction chamber that holds at least one substrate; and forming a silicon oxynitride film on said at least one substrate by reacting these gases, under predetermined temperature and pressure conditions.

Preferably, the aforesaid oxygen-containing gas is selected from the group essentially consisting Of $O_2$, $O_3$, $H_2O$, $H_2O_2$, NO, $NO_2$, and/or $N_2O$ or any mixture thereof.

According to still another aspect of this invention, there is provided a method for producing silicon oxynitride films by thermal chemical vapor deposition, comprising the steps of:

feeding at least one trisilylamine gas and at least one gas containing both oxygen and nitrogen as constituent elements into a chemical vapor deposition reaction chamber that holds at least one substrate; and forming a silicon oxynitride film on said at least one substrate by reacting the two gases under predetermined temperature and pressure conditions.

Preferably, the aforesaid gas containing both oxygen and nitrogen as constituent elements is selected from the group consisting of NO, $NO_2$, and/or $N_2O$ or any mixture thereof.

The invention includes methods to achieve the desired results, as described, but is not limited to the various embodiments disclosed.

BRIEF DESCRIPTION OF THE DRAWINGS

The invention includes methods to achieve the desired results, as described, but is not limited to the various embodiments disclosed.

DETAILED DESCRIPTION OF THE INVENTION

Figure 1:
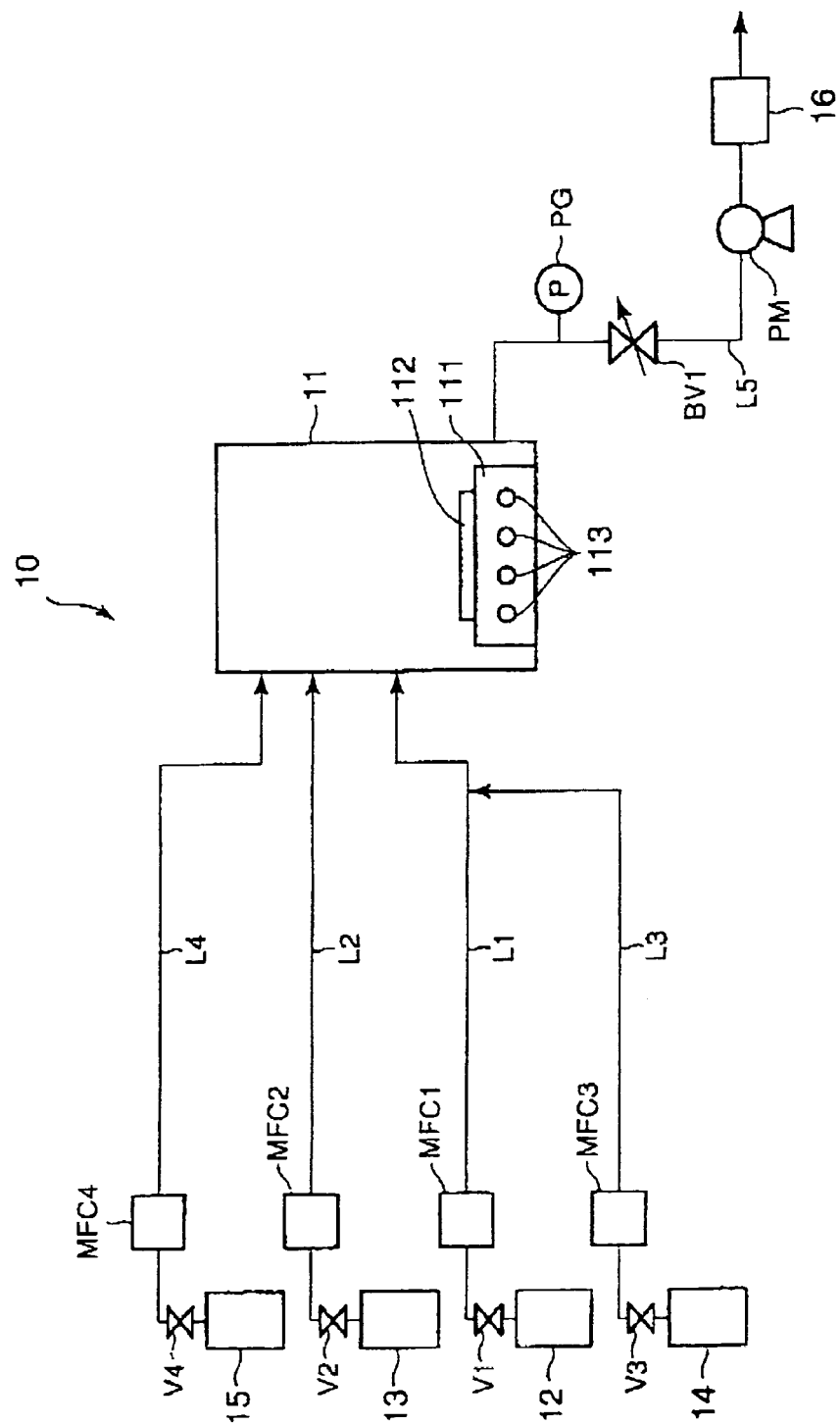
FIG. 1 contains a block diagram that illustrates an example of an apparatus for producing silicon (oxy)nitride films.

This invention relates to methods for forming silicon nitride films and silicon oxynitride films (referred to as silicon (oxy)nitride films hereinbelow) on substrates by thermal CVD and uses trisilylamine (TSA) as a precursor for silicon (oxy)nitride films.

The methods for producing silicon nitride films will be considered first. A silicon nitride film is formed on substrate in this case by feeding TSA gas, ammonia gas, and an optional dilution gas into a chemical vapor deposition reaction chamber (abbreviated below as the CVD reaction chamber) that holds at least 1 substrate (particularly a semiconductor substrate such as a silicon substrate) and reacting the TSA gas with the ammonia gas. The substrate may already be provided with an oxide film, such as a silicon oxide film.

The pressure in the CVD reaction chamber during this reaction between TSA gas and ammonia gas can be maintained at from 0.1 torr to 1 atmosphere. This reaction (silicon nitride film formation) can generally be run at temperatures $\leq 1,000°$ C. However, since almost no production of silicon nitride occurs at temperatures below 300° C., the reaction between TSA gas and ammonia gas will generally be run at 300° C. to 1,000° C. The ammonia gas and TSA gas will generally be fed into the CVD reaction chamber at an $NH_3$/TSA flow rate ratio of at least 4. While silicon nitride can also be produced at $NH_3$/TSA flow rate ratios above 500, such $NH_3$/TSA flow rate ratios above 500 are uneconomical.

The inert dilution gas introduced on an optional basis into the CVD reaction chamber can be an inert gas, for example, nitrogen or a rare gas such as argon.

Since TSA contains neither carbon nor chlorine, its reaction with ammonia does not generate the ammonium chloride by-product that has heretofore been a problem and the silicon nitride film product does not become contaminated with carbonaceous material.

It has been discovered, in accordance with the first aspect of this invention, that the compositional stability of the silicon nitride film product is significantly improved by the use of an $NH_3$/TSA flow rate ratio of at least 10 during reaction of the TSA gas and ammonia gas as described above to produce silicon nitride film. In other words, silicon nitride film is produced by reacting ammonia gas and TSA gas under the aforementioned pressure and reaction temperature conditions using, according to the first aspect of this invention, a value of at least 10 for the feed flow ratio of the ammonia gas to the TSA gas that are fed into the CVD reaction chamber. This use of a value of at least 10 for the $NH_3$/TSA flow rate ratio enables the production of silicon nitride for which the compositional variation of the silicon nitride film within the plane of the semiconductor substrate due to flow rate ratio fluctuations is restrained to very small variation rates of no more than 8%. An almost constant silicon nitride film composition is obtained at $NH_3$/TSA flow rate ratios $\geq 20$.

It has also been discovered, in accordance with the second aspect of this invention, that the step coverage performance of the silicon oxynitride film product is significantly improved by the use of a value no greater than 600° C. for the ammonia gas/TSA gas reaction temperature during reaction of the TSA gas and ammonia gas as described above to produce silicon nitride film. In other words, silicon nitride film is produced by reacting ammonia gas and TSA gas under the aforementioned pressure and $NH_3$/TSA flow rate ratio conditions using, according to the second aspect of this invention, an ammonia gas/TSA gas reaction temperature no greater than 600° C.

As used herein, the reaction temperature generally denotes the temperature of or near the substrate on which the silicon nitride is formed. While this invention is not limited to the following means, the temperature of the substrate can be measured using a radiation thermometer, which converts the intensity of the radiation from the substrate directly into temperature, or using a thermocouple disposed in the vicinity of the substrate. When a thermocouple is employed, it will generally be disposed within the susceptor that supports the substrate or in the gas region near the substrate, but other locations can be used as long as they enable estimation of the temperature of the substrate.

The step coverage performance can be evaluated using the step coverage ratio as an index. This step coverage ratio can be defined as the value afforded by dividing the minimum film thickness at a step feature by the film thickness in a flat or planar region. The reaction of ammonia gas with TSA gas at a temperature no greater than 600° C. in accordance with the second aspect of this invention can achieve step coverage ratios of about 0.9 even for apertures with an aspect ratio of 10.

As the preceding description makes clear, for the purpose of producing silicon nitride film with a uniform composition and an excellent step coverage ratio it will be desirable to use an $NH_3$/TSA flow rate ratio of at least 10 in combination with a reaction temperature no greater than 600° C.

Silicon oxynitride films can be formed on substrates in accordance with the present invention by introducing at least 1 oxygen-containing gas into the CVD reaction chamber in addition to the TSA, nitrogenous gas, and optional dilution gas described above in connection with the formation of silicon nitride films. This oxygen-containing gas is preferably free of carbon and chlorine and can be an oxygen-containing gas selected from the group consisting of oxygen ($O_2$), ozone ($O_3$), water vapor ($H_2O$), hydrogen peroxide ($H_2O_2$), nitric oxide (NO), nitrogen dioxide ($NO_2$), and nitrous oxide ($N_2O$).

A silicon oxynitride film can be formed on substrate by reacting TSA, ammonia gas, and an oxygen source gas under the pressure, temperature, and gas flow rate ratio conditions described in connection with the production of silicon nitride films.

Ammonia gas need not be separately introduced when the oxygen source gas is a gas that contains both oxygen and nitrogen as constituent elements (referred to hereinbelow as (oxygen+nitrogen)-containing gas). The (oxygen+nitrogen)-containing gas can be selected from the group consisting of nitric oxide (NO), nitrogen dioxide ($NO_2$), and nitrous oxide ($N_2O$).

The oxygen source gas can be introduced into the CVD reaction chamber at an oxygen source gas/TSA gas flow rate ratio of 0.1 to 100.

The TSA gas used here can be prepared in advance and stored in, for example, a sealed container, but it can also be synthesized onsite and the TSA gas thus synthesized can be introduced directly into the CVD reaction chamber. TSA gas can be synthesized onsite by introducing ammonia gas and a halosilane that will react with ammonia to produce TSA, for example, dichlorosilane (DCS), into a synthesis chamber. At this point, an inert dilution gas, such as the inert dilution gas that may be introduced into the reaction chamber, can also be introduced into the synthesis chamber along with the aforementioned reaction gases. With regard to the conditions during introduction of the ammonia ($NH_3$) gas and DCS gas into the synthesis chamber, the pressure in the synthesis chamber should be maintained at 300 to 400 torr and the $NH_3$ gas/DCS flow rate ratio should be 2.5 to 3. The two gases can be reacted at 50 to 300° C. This reaction produces TSA gas. While ammonium chloride is produced in this case, it can be removed using a filter or trap prior to introduction into the CVD reaction chamber. The resulting TSA gas freed of ammonium chloride can be introduced into the CVD reaction chamber after its pressure has been adjusted using a pressure regulator.

FIG. 1 contains a block diagram that illustrates an example of an apparatus for producing silicon (oxy)nitride films that is suitable for implementing the inventive method for producing silicon (oxy)nitride films. The apparatus illustrated in FIG. 1 uses a TSA gas source that contains already prepared TSA gas.

The production apparatus 10 illustrated in FIG. 1 is provided with a CVD reaction chamber 11, a TSA gas source 12, an ammonia gas source 13, and a source 14 of the inert dilution gas that is introduced on an optional basis. When the production of silicon oxynitride films is desired, the production apparatus 10 can also be provided with an oxygen source gas source 15. In other words, an oxygen source gas feed system (the oxygen source gas source 15 and its attendant features (supply lines, etc.)) is unnecessary when the production of silicon nitride films is being pursued.

A susceptor 111 is disposed within the CVD reaction chamber 11, and a semiconductor substrate 112, such as a silicon substrate, is mounted on the susceptor 111 (a single semiconductor substrate is mounted on the susceptor 111 since the apparatus illustrated in FIG. 1 is a single-wafer apparatus). A heater 113 is provided within the susceptor 111 in order to heat the semiconductor substrate 112 to the prescribed CVD reaction temperature. From several semiconductor substrates to 250 semiconductor substrates may be held in the CVD reaction chamber in the case of a batch apparatus. The heater used in a batch apparatus can have a different structure from the heater used in a single-wafer apparatus.

The TSA gas source 12 comprises a sealed container that holds liquefied TSA. The TSA gas is introduced from its source 12 through the TSA gas feed line L1 and into the CVD reaction chamber 11. There are disposed in this line L1 a shut-off valve V1 and, downstream therefrom, a flow rate controller such as, for example, a mass flow controller MFC1. The TSA gas is subjected to control to a prescribed flow rate by the mass flow controller MFC1 and is introduced into the CVD reaction chamber 11.

The ammonia gas source 13 comprises a sealed container that holds liquefied ammonia. The ammonia gas is introduced from its source 13 through the ammonia gas feed line L2 and into the CVD reaction chamber 11. There are disposed in this line L2 a shut-off valve V2 and, downstream therefrom, a flow rate controller such as, for example, a mass flow controller MFC2. The ammonia gas is subjected to control to a prescribed flow rate by the mass flow controller MFC2 and is introduced into the CVD reaction chamber 11.

The inert dilution gas source 14 comprises a sealed container that holds the inert dilution gas. As necessary or desired, the inert dilution gas is introduced from its source 14 and into the CVD reaction chamber 11 through the inert dilution gas feed line L3. As shown in FIG. 1, the inert dilution gas feed line L3 can be joined with the TSA gas feed line L1 and the inert dilution gas can thereby be introduced into the CVD reaction chamber 11 in combination with the TSA gas. There are disposed in this line L3 a shut-off valve V3 and, downstream therefrom, a flow rate controller such as, for example, a mass flow controller MFC3. The inert gas is subjected to control to a prescribed flow rate by the mass flow controller MFC3 and is introduced into the CVD reaction chamber 11.

The oxygen source gas source 15 used during the production of silicon oxynitride films comprises a sealed container that holds the oxygen source gas. The oxygen source gas is introduced from its source 15 and into the CVD reaction chamber 11 through the oxygen source gas feed line L4. There are disposed in this line L4 a shut-off valve V4 and, downstream therefrom, a flow rate controller such as, for example, a mass flow controller MFC4. The oxygen source gas is subjected to control to a prescribed flow rate by the mass flow controller MFC4 and is introduced into the CVD reaction chamber 11.

The outlet from the CVD reaction chamber 11 is connected to a waste gas treatment facility 16 by the line L5. This waste gas treatment facility 16 removes, for example, by-products and unreacted material, and the gas purified by the waste gas treatment facility 16 is discharged from the system. There are disposed in the line L5 a pressure sensor PG, a pressure regulator such as a butterfly valve BV1, and a vacuum pump PM. The introduction of each gas into the CVD reaction chamber 11 is carried out by the respective mass flow controllers, while the pressure within the CVD reaction chamber 11 is monitored by the pressure sensor PG and is established at a prescribed pressure value by operation of the pump PM and control of the aperture of the butterfly valve BV1.

When an (oxygen+nitrogen)-containing gas is used as the oxygen source gas during the production of silicon oxynitride films, silicon oxynitride film production can be carried out, as is clear from the preceding discussion, without the installation of the ammonia gas feed system (the ammonia gas source 13 and its attendant features (the valve V2, MFC2, and line L2)).

Figure 2:
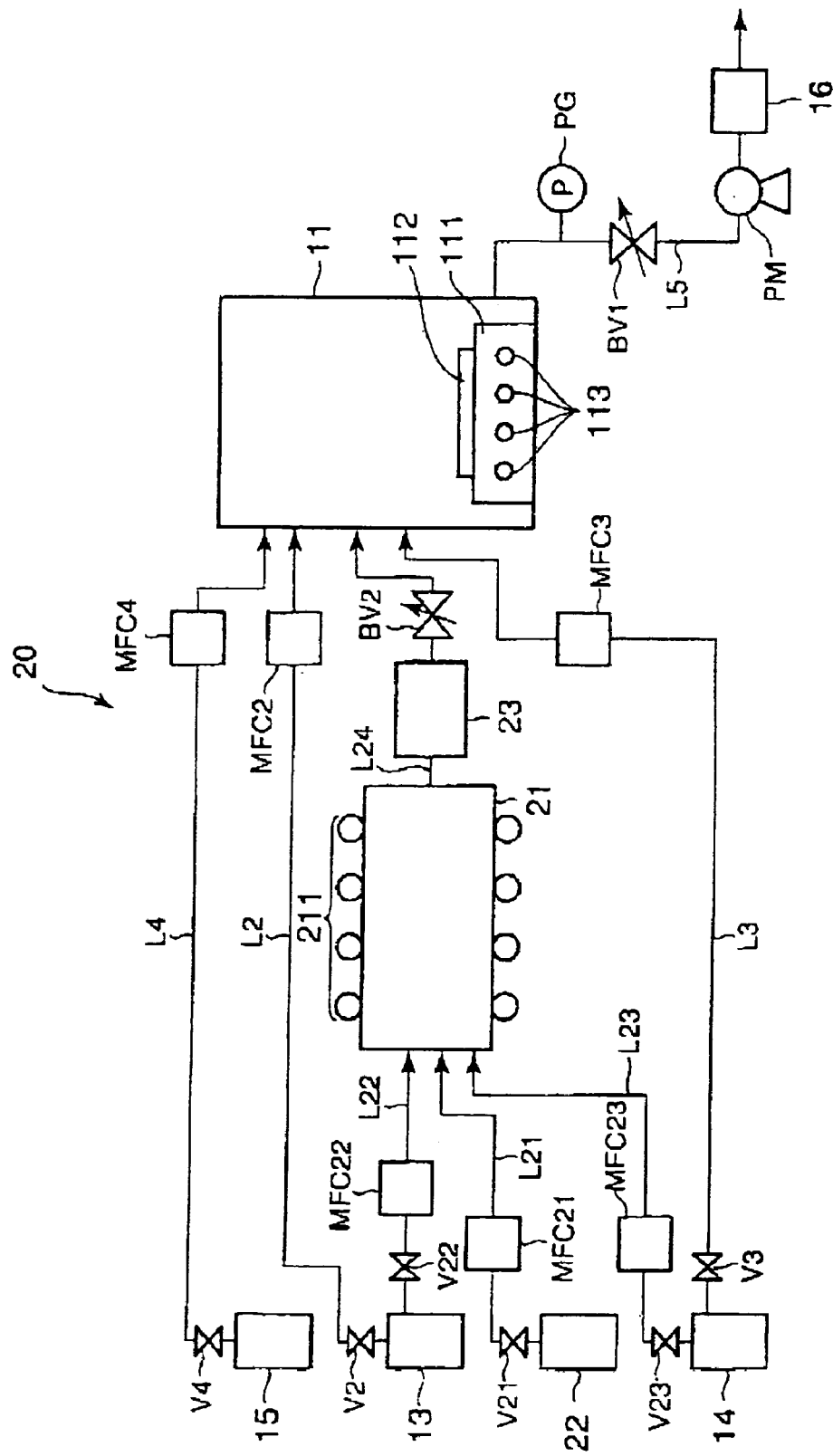
FIG. 2 contains a block diagram that illustrates another example of an apparatus for producing silicon (oxy)nitride films.

FIG. 2 contains a block diagram that illustrates one example of an apparatus for producing silicon (oxy)nitride films that contains an onsite facility for producing TSA gas. Those constituent elements in FIG. 2 that are the same as in FIG. 1 are assigned the same reference symbol and their detailed explanation has been omitted.

The production apparatus 20 illustrated in FIG. 2, in addition to having the same type of CVD reaction chamber 11 as the one illustrated in FIG. 1, contains a synthesis chamber 21 for the onsite synthesis of TSA gas. A heater 211 is disposed on the circumference of this synthesis chamber 21 for the purpose of heating the interior of the synthesis chamber 21 to the prescribed reaction temperature.

The production apparatus 20 illustrated in FIG. 2 lacks the TSA gas source 12 shown in FIG. 1 and contains a source 22 of a halosilane gas, such as dichlorosilane, that will react with ammonia to produce TSA. The halosilane gas source 22 comprises a sealed container that holds halosilane gas. Halosilane gas is introduced from this source 22 through the feed line L21 and into the synthesis chamber 21. There are disposed in the line L21 a shut-off valve V21 and, downstream therefrom, a flow rate controller such as, for example, a mass flow controller MFC21. The halosilane gas is subjected to control to a prescribed flow rate by the mass flow controller MFC21 and is introduced into the synthesis chamber 21.

The ammonia gas source 13 is provided with a feed line L22 to the synthesis chamber 21 in addition to the feed line L2 to the CVD reaction chamber 11. There are disposed in this feed line L22 a shut-off valve V22 and, downstream therefrom, a flow rate controller such as, for example, a mass flow controller MFC22. The ammonia gas is subjected to control to a prescribed flow rate by the mass flow controller MFC22 and is introduced into the synthesis chamber 21.

The inert dilution gas source 14 is provided with a feed line L23 to the synthesis chamber 21 in addition to the feed line L3 to the CVD reaction chamber 11. There are disposed in this feed line L23 a shut-off valve V23 and, downstream therefrom, a flow rate controller such as, for example, a mass flow controller MFC23. The inert dilution gas is subjected to control to a prescribed flow rate by the mass flow controller MFC23 and is introduced into the synthesis chamber 21. The line L3 in the apparatus in FIG. 2 is directly connected to the CVD reaction chamber 11.

The outlet from the synthesis chamber 21 is connected by the line L24 to the CVD reaction chamber 11. There are disposed in the line L24 a powder trap 23 and, downstream therefrom, a pressure regulator, for example, a butterfly valve BV2. The purpose of the powder trap 23 is to remove silazane solids and particulate ammonium chloride generated as by-products in the synthesis chamber 21. The TSA gas afforded by the synthesis chamber 21 is subjected to removal of the solid silazane and ammonium chloride by-products by the powder trap 23 and is introduced into the CVD reaction chamber 11 after the pressure has been adjusted by the butterfly valve BV2 as appropriate for introduction into the CVD reaction chamber 11.

EXAMPLES

This invention will be described in additional detail by working examples as follows, but this invention is not limited to these working examples.

Example 1

A production apparatus as illustrated in FIG. 1 (lacking, however, an oxygen source gas feed system) was used in this example. Ammonia gas and TSA gas were introduced into a CVD reaction chamber holding a silicon substrate and a silicon nitride film was formed on this silicon substrate under the following conditions.
  ammonia gas flow rate: 40 sccm
  TSA gas flow rate: 0.5 sccm
  pressure within the CVD reaction chamber: 1 torr
  reaction temperature: 640° C.

The resulting silicon nitride film was confirmed by Auger spectroscopy to have the composition $Si_{0.81}N$. The deposition (growth) rate of this silicon nitride film was 17 Å/min. The $NH_3$/TSA flow rate ratio in this example was 80, and a stable film composition was achieved.

Example 2

A production apparatus as illustrated in FIG. 1 (lacking, however, an oxygen source gas feed system) was used in this example. Ammonia gas and TSA gas were introduced into a CVD reaction chamber holding a silicon substrate and a silicon nitride film was formed on this silicon substrate under the following conditions.
  ammonia gas flow rate: 40 sccm
  TSA gas flow rate: 4 sccm
  pressure within the CVD reaction chamber: 1 torr
  reaction temperature: 560° C.

The resulting silicon nitride film was confirmed by Auger spectroscopy to have the composition $Si_{1.04}N$. The deposition (growth) rate of this silicon nitride film was 6 Å/min. The $NH_3$/TSA flow rate ratio in this example was 10, and a stable film composition was achieved.

Example 3

A production apparatus as illustrated in FIG. 1 (lacking, however, an oxygen source gas feed system) was used in this example. Ammonia gas and TSA gas were introduced into a CVD reaction chamber holding a silicon substrate, and a silicon nitride film was formed on this silicon substrate using a pressure within the CVD reaction chamber of 1 torr and a reaction temperature of 600° C. Silicon nitride film formation was carried out at different $NH_3$/TSA flow rate ratios over the range from 0 to 80. Auger spectroscopy was used to analyze the composition of the silicon nitride films obtained at the different $NH_3$/TSA flow rate ratios, and the compositional variation rate was calculated from the equation $$\text{compositional variation rate} = -d(Si/N)dX$$

wherein X is the NH$_3$/TSA flow rate ratio. The results are reported in FIG. 3.

Figure 3:
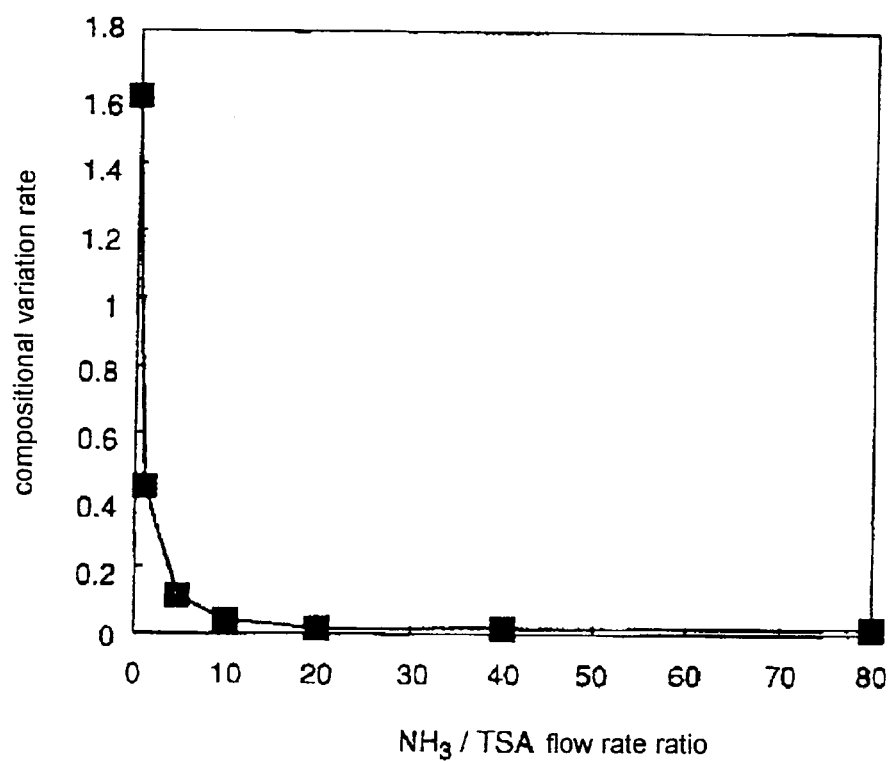
FIG. 3 contains a graph that reports the relationship between the ammonia gas/trisilylamine gas flow rate ratio and the compositional variation rate of silicon nitride films.

The results reported in FIG. 3 show that the film compositional variation rate due to changes in the flow rate ratio assumed very small values when the NH$_3$/TSA flow rate ratio was at least 10 and more particularly that the film compositional variation rate became approximately 0 when the NH$_3$/TSA flow rate ratio was at least 20.

Example 4

(A) Using a production apparatus with the structure shown in FIG. 1 (lacking, however, an oxygen source gas feed system), silicon nitride films were formed at different reaction temperatures in a CVD reaction chamber holding a silicon substrate on which trenches (diameter: 0.6 μm) with an aspect ratio (depth/diameter) of 10 had been formed. Ammonia gas was introduced at a flow rate of 40 sccm; TSA gas was introduced at a flow rate of 0.5 sccm; and a pressure of 1 torr was established in the CVD reaction chamber. The step coverage ratios of the silicon nitride films obtained at the different temperatures were measured by scanning electron microscopy (SEM), and the results are reported in FIG. 4.

Figure 4:
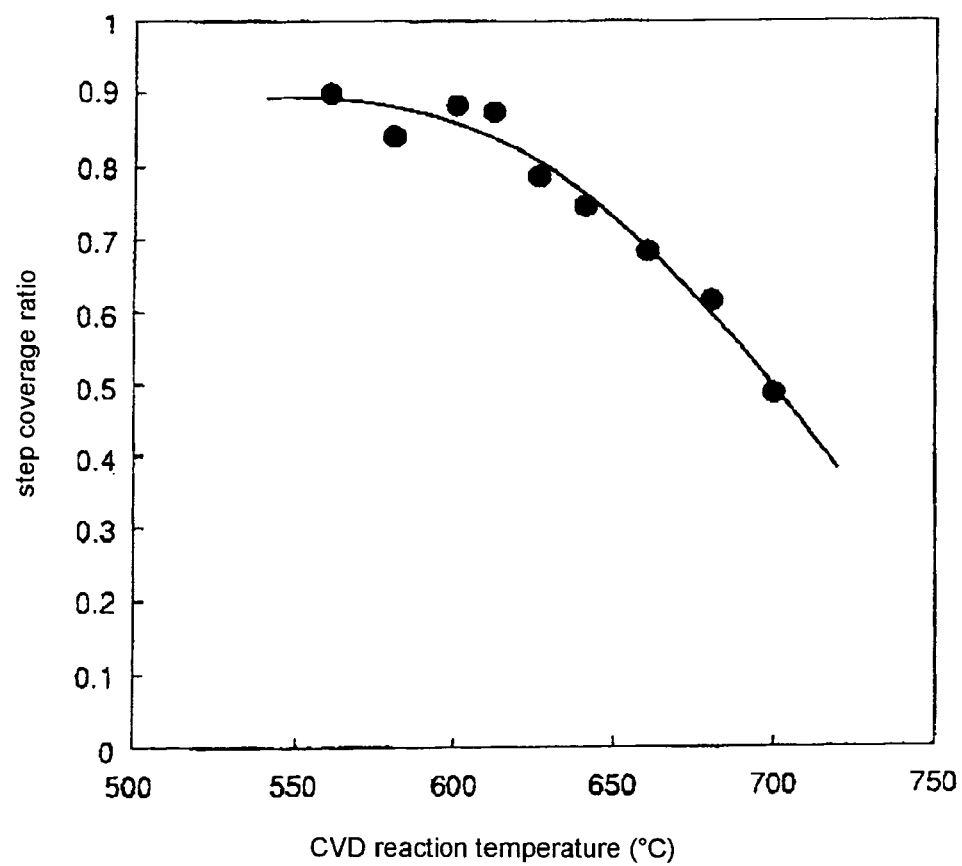
FIG. 4 contains a graph that reports the relationship between the CVD reaction temperature and the step coverage ratio afforded by silicon nitride films.

The results in FIG. 4 show that the step coverage performance of the produced silicon nitride films was improved up to about 0.9 through the use of a reaction temperature no greater than 600° C.

(B) The thermal stability of TSA was also evaluated. The TSA concentration at the CVD reaction chamber outlet was measured with a mass spectrometer at different temperatures within the CVD reaction chamber. TSA gas was introduced into the CVD reaction chamber during these experiments at a flow rate of 0.12 sccm and ammonia gas was introduced at a flow rate of 10 sccm. The ratio of the TSA concentration at the outlet from the CVD reaction chamber to the TSA concentration at the inlet was calculated and is reported in FIG. 5.

Figure 5:
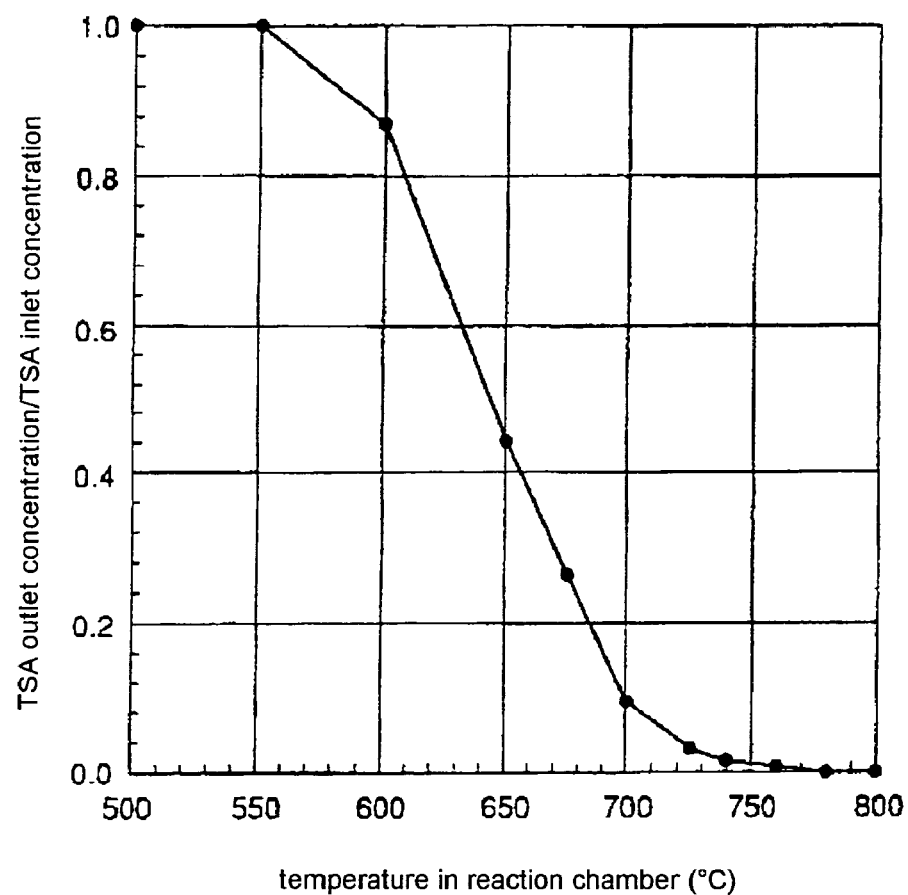
FIG. 5 contains a graph that reports the relationship between the trisilylamine decomposition rate and temperature.

The results in FIG. 5 show that the TSA outlet concentration/TSA inlet concentration undergoes a sharp decline above 600° C., or in other words that the TSA decomposition rate undergoes a sharp increase above 600° C.

These results show that the step coverage performance of silicon nitride films formed by the reaction of ammonia and TSA is closely related to the TSA decomposition temperature and is significantly better (a step coverage ratio of about 0.9 is reached at temperatures $\leq$600° C.) at temperatures no greater than 600° C. where TSA decomposition substantially does not occur. It is thought that reaction intermediates produced by the vapor-phase decomposition reaction of TSA cause a deterioration in the step coverage performance.

Example 5

A production apparatus with the structure illustrated in FIG. 2 (lacking, however, an oxygen source gas feed system) was used in this example. DCS gas was introduced at a flow rate of 20 sccm, ammonia gas was introduced at a flow rate of 54 sccm, and nitrogen gas (inert dilution gas) was introduced at a flow rate of 20 sccm while the pressure within the synthesis chamber was maintained at 300–400 torr and the temperature was maintained at 200° C. The composition of the synthesis chamber effluent gas was analyzed by gas chromatography at the synthesis chamber outlet downstream from the powder trap. The composition was determined to be 5 volume % TSA with the remainder being mainly nitrogen. This effluent gas was directly introduced into the CVD reaction chamber after adjustment of its pressure. Ammonia gas was also introduced into the CVD reaction chamber. The following conditions were used.

ammonia gas flow rate: 20 sccm
effluent gas flow rate: approximately 20 sccm
pressure within the CVD reaction chamber: 1 torr
reaction temperature: 635° C.

The resulting silicon nitride film was confirmed by Auger spectroscopy to have the composition $Si_{0.9}N$. The deposition (growth) rate of this silicon nitride film was 18 Å/min. Neither carbon nor chlorine was detected by Auger spectroscopy in the silicon nitride film product.

Example 6

The production apparatus illustrated in FIG. 1 was used in this example. Silicon oxynitride film was formed on a silicon substrate under the following conditions by admitting ammonia gas and nitrogen-diluted TSA gas (5 volume % TSA) into a CVD reaction chamber holding a silicon substrate.

ammonia gas flow rate: 17 sccm
flow rate of nitrogen-diluted TSA gas: 2.5 sccm
oxygen flow rate: 0.5 sccm
pressure within the CVD reaction chamber: 10 torr
reaction temperature: 600° C.

The resulting silicon oxynitride film was confirmed by Auger spectroscopy to have the composition $Si_{0.78}N_1O_{0.1}$. The deposition (growth) rate of this silicon oxynitride film was 15.5 Å/min.

This invention has been described hereinabove through various embodiments and working examples, but this invention is not limited thereto. The various embodiments described above can be combined as appropriate.

Advantageous Effects of the Invention

As has been described hereinabove, the inventive methods enable the production of silicon nitride films and silicon oxynitride films without the accompanying production of ammonium chloride and without incorporation of carbonaceous contaminants in the film. More particularly, the use of an ammonia gas/trisilylamine gas flow rate ratio of at least 10 during the CVD reaction enables the production of silicon nitride films that have small compositional variation rates. Moreover, the use of a CVD reaction temperature no greater than 600° C. enables the production of silicon nitride films that exhibit an excellent step coverage performance.

Of course, the invention described in the present specification comprises also the introduction of one or several trisilylamine containing gases, one or several ammonia containing gases and one or several oxygen containing gases in the reactor.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A method for producing silicon nitride films by thermal chemical vapor deposition comprising:
   i) feeding a trisilylamine gas and an ammonia gas into a chemical vapor deposition reaction chamber that contains at least one substrate;

ii) forming a silicon nitride film on said at least one substrate by reacting said gases under predetermined temperature and pressure conditions; and iii) providing a flow rate ratio between said ammonia gas to said trisilylamine gas fed in said reaction chamber equal to or greater than about 10.

2. The method according to claim 1, wherein the predetermined temperature conditions for the reaction between said trisilylamine and said ammonia gas is set at a temperature which is equal to or lower than about 600° C.

3. The method according to claim 1, wherein said flow rate ratio is greater than about 20.

4. A method for producing silicon nitride films by thermal chemical vapor deposition comprising:

i) feeding a trisilylamine gas and an ammonia gas into a chemical vapor deposition reaction chamber that contains at least one substrate;

ii) forming a silicon nitride film on said at least one substrate by reacting said gases under predetermined temperature and pressure conditions; and iii) setting the predetermined temperature of the reaction between said trisilylamine and said ammonia gas at a value equal to or lower than 600° C.

5. A method for producing silicon nitride films by thermal chemical vapor deposition comprising:

i) feeding at least one trisilylamine gas and at least one ammonia gas into a chemical vapor deposition reaction chamber that contains at least one substrate;

ii) forming at least one silicon nitride film on said at least one substrate by reacting said gases under predetermined temperature and pressure conditions; and iii) providing a flow rate ratio between at least one said ammonia gas to at least one said trisilylamine gas fed in said reaction chamber equal to or greater than about 10.

6. The method according to claim 5, wherein the predetermined temperature conditions for the reaction between at least one said trisilylamine and at least one said ammonia gas is set at a temperature which is equal to or lower than about 600° C.

7. The method according to claim 5, wherein said flow rate ratio is greater than about 20.

8. A method for producing silicon nitride films by thermal chemical vapor deposition comprising:

i) feeding at least one trisilylamine gas and at least one ammonia gas into a chemical vapor deposition reaction chamber that contains at least one substrate;

ii) forming at least one silicon nitride film on said at least one substrate by reacting said gases under predetermined temperature and pressure conditions; and iii) setting the predetermined temperature of the reaction between at least one said trisilylamine and at least one said ammonia gas at a value equal to or lower than 600° C.

9. A method for producing silicon nitride-containing films by thermal chemical vapor deposition comprising:

i) feeding a trisilylamine-containing gas and an ammonia-containing gas into a chemical vapor deposition reaction chamber that contains at least one substrate;

ii) forming a silicon nitride-containing film on said a substrate by reacting said gases under predetermined temperature and pressure conditions; and iii) providing a flow rate ratio between an ammonia-containing gas to a trisilylamine-containing gas fed in said reaction chamber equal to or greater than about 10.

10. The method according to claim 9, wherein the predetermined temperature conditions for the reaction between a trisilylamine-containing gas and an ammonia-containing gas is set at a temperature which is equal to or lower than about 600° C.

11. The method according to claim 7, wherein said flow rate ratio is greater than about 20.

12. A method for producing silicon nitride-containing films by thermal chemical vapor deposition comprising:

i) feeding a trisilylamine-containing gas and an ammonia-containing gas into a chemical vapor deposition reaction chamber that contains at least one substrate;

ii) forming a silicon nitride-containing film on said at least one substrate by reacting said gases under predetermined temperature and pressure conditions; and iii) setting the predetermined temperature of the reaction between a trisilylamine-containing gas and an ammonia-containing gas at a value equal to or lower than 600° C.

13. A method for producing silicon nitride-containing films by thermal chemical vapor deposition comprising:

i) feeding at least one trisilylamine-containing gas and at least one ammonia-containing gas into a chemical vapor deposition reaction chamber that contains at least one substrate;

ii) forming at least one silicon nitride-containing film on said at least one substrate by reacting said gases under predetermined temperature and pressure conditions; and iii) providing a flow rate ratio between at least one ammonia-containing gas to at least one trisilylamine-containing gas fed in said reaction chamber equal to or greater than about 10.

14. The method according to claim 13, wherein the predetermined temperature conditions for the reaction between at least one trisilylamine-containing gas and at least one ammonia-containing gas is set at a temperature which is equal to or lower than about 600° C.

15. The method according to claim 13, wherein said flow rate ratio is greater than about 20.

16. A method for producing silicon nitride-containing films by thermal chemical vapor deposition comprising:

i) feeding at least one trisilylamine-containing gas and at least one ammonia-containing gas into a chemical vapor deposition reaction chamber that contains at least one substrate;

ii) forming at least one silicon nitride-containing film on said at least one substrate by reacting said gases under predetermined temperature and pressure conditions; and iii) setting the predetermined temperature of the reaction between at least one trisilylamine-containing gas and at least one ammonia-containing gas at a value equal to or lower than 600° C.

* * * * *

UNITED STATES PATENT AND TRADEMARK OFFICE
CERTIFICATE OF CORRECTION

| | | |
|---|---|---|
| PATENT NO. | : 7,192,626 B2 | Page 1 of 1 |
| APPLICATION NO. | : 10/669623 | |
| DATED | : March 20, 2007 | |
| INVENTOR(S) | : Christian Dussarrat et al. | |

It is certified that error appears in the above-identified patent and that said Letters Patent is hereby corrected as shown below:

In Column 12, claim 11, replace the words "claim 7" with the words --claim 9--.

Signed and Sealed this

Fifth Day of June, 2007

JON W. DUDAS
*Director of the United States Patent and Trademark Office*